(12) United States Patent
Tanaka et al.

(10) Patent No.: US 8,129,497 B2
(45) Date of Patent: Mar. 6, 2012

(54) ORGANIC THIN FILM TRANSISTOR

(75) Inventors: Tatsuo Tanaka, Sagamihara (JP);
Hiroshi Kita, Hachioji (JP); Katsura Hirai, Hachioji (JP); Chiyoko Takemura, Tokyo (JP); Rie Katakura, Hino (JP)

(73) Assignee: Konica Minolta Holdings, Inc. (JP)

( * ) Notice: Subject to any disclaimer, the term of this patent is extended or adjusted under 35 U.S.C. 154(b) by 629 days.

(21) Appl. No.: 11/145,667

(22) Filed: Jun. 6, 2005

(65) Prior Publication Data

US 2005/0274954 A1  Dec. 15, 2005

(30) Foreign Application Priority Data

Jun. 10, 2004  (JP) ................................. 2004-172317
May 11, 2005  (JP) ................................. 2005-138357

(51) Int. Cl.
*C08G 73/00*  (2006.01)

(52) U.S. Cl. ........... 528/422; 528/86; 428/690; 428/917

(58) Field of Classification Search .................... 257/40, 257/E51.001, E51.027, E51.033; 438/99, 438/149, 151; 528/422, 86; 427/59; 428/690, 428/917

See application file for complete search history.

(56) References Cited

U.S. PATENT DOCUMENTS 5,549,997 A  *  8/1996  Matsushima et al. ........ 430/58.15
(Continued)

FOREIGN PATENT DOCUMENTS

EP  1 439 590 A2  7/2004

OTHER PUBLICATIONS

English Abstract for Japanese Patent Application No. 2003-261655 dated Sep. 19, 2003 corresponding to US 6,770,904.

(Continued)

*Primary Examiner* — Zandra Smith
*Assistant Examiner* — Tsz Chiu
(74) *Attorney, Agent, or Firm* — Cantor Colburn LLP

(57) ABSTRACT

An organic thin film transistor comprising a semiconductor layer containing a thiophene oligomer which has a thiophene ring having a substituent and a partial structure constituted by directly connected two or more thiophene rings each having no substituent, and contains three to forty thiophene rings per molecule.

9 Claims, 2 Drawing Sheets

U.S. PATENT DOCUMENTS

| | | | |
|---|---|---|---|
| 6,331,356 B1 * | 12/2001 | Angelopoulos et al. | 428/411.1 |
| 6,770,904 B2 | 8/2004 | Ong et al. | |
| 6,872,801 B2 | 3/2005 | Ong et al. | |
| 7,166,689 B2 * | 1/2007 | Sagisaka et al. | 528/422 |
| 7,538,175 B2 * | 5/2009 | Qi et al. | 528/162 |
| 7,765,686 B2 * | 8/2010 | Murakami et al. | 29/831 |
| 7,768,001 B2 * | 8/2010 | Yamaga et al. | 257/40 |
| 7,816,674 B2 * | 10/2010 | Kato et al. | 257/40 |
| 2002/0045729 A1 * | 4/2002 | Kerres et al. | 528/391 |
| 2002/0053666 A1 * | 5/2002 | Marks et al. | 257/40 |
| 2003/0160230 A1 * | 8/2003 | Ong et al. | 257/20 |
| 2003/0160234 A1 * | 8/2003 | Ong et al. | 257/40 |
| 2005/0277760 A1 * | 12/2005 | Ong et al. | 528/380 |

OTHER PUBLICATIONS

English Abstract for Japanese Patent Application No. 2003-268083 dated Sep. 25, 2003 corresponding to US 6,872,801.

English Abstract for Japanese Patent Application No. 2004-186695 dated Jul. 2, 2004 corresponding to European Patent Application No. EP 1 439 590 A2.

Beng S. Ong, et al. "High-Preformance Semiconducting Polythiophenes for Organic Thin-Film Transistors" J. Am. Chem. Soc. 2004, 126, 3378-3379.

* cited by examiner

ORGANIC THIN FILM TRANSISTOR

FIELD OF THE INVENTION

The invention relates to an organic thin film transistor.

BACKGROUND OF THE INVENTION

Need of flat panel display for computer rises accompanied with spreading of information terminals. Moreover, electronic paper or digital paper as a thin, light and easily mobile displaying medium is needed because the chance of providing information in a form of electronic signals instead of paper medium is increased accompanied with the progress of information system.

In the planar displaying apparatus, the displaying medium is generally constituted by the use of an element applying liquid crystal, organic EL or electrophoresis. In such the displaying medium, technology in which an active driving element (TFT element) is principally applied for obtaining a uniformity of the brightness and a high rewrite speed of the image. In usual displays for computer, for example, the TFT elements are formed on a glass substrate and the liquid crystals or the organic EL elements are sealed.

A semiconductor such as a-Si (amorphous silicon) and p-Si (polysilicon) is employable for the TFT element. The TFT element is formed by successively laminating the silicon semiconductor and a metal layer according to necessity for forming a source electrode, a drain electrode and a gate electrode. A production process utilizing vacuum such as a spattering process is usually needed for producing the TFT element.

In the production of the TFT element, the production process including a vacuum process using a vacuum chamber has to be repeatedly applied for forming the constituting layers. Consequently, the costs for equipment and running the production become very high. For the TFT element, processes such as a vacuum deposition, doping and photolithography should be repeatedly performed for each of the layers. Therefore, the element is formed on the substrate through several tens processes. In a semiconductor portion making the important point of switching action, plural kinds of layer such as a p-type semiconductor layer and an n-type semiconductor layer are laminated. In such the processes for producing the silicon semiconductor, the change of the equipment corresponding to the requirement of large-sizing of the displaying image is difficult because a largely changing in the design of the production apparatus such as the vacuum chamber is necessary.

The material of the substrate is limited to one having a resistivity against heating in the processes since the usual production processes for the TFT using silicon include a process performed at high temperature. Consequently, glass is only practically usable. Therefore, the displaying apparatus becomes one which is heavy, lacking in the flexibility and easily broken by falling when the displaying apparatus is constituted by the usual TFT elements. Such the properties caused by forming the TFT elements on the glass substrate are not suitable for satisfying the requirements for the light mobile thin display accompanied with the progress of the information system.

Besides, studying on organic semiconductor material having high charge transfer ability is aggressively progressed. Such the compounds are expected as an element of an organic laser oscillation element (cf., for example, Non-patent Document 1) additionally to the charge transfer material of the organic EL element, and that of organic thin film transistor such as those reported in various reports (cf., for example, refer Non-patent Document 2).

It may be made possible by realization of such the organic semiconductor devices that the simplification of the production process by applying a vapor deposition under vacuum or low pressure at a relatively low temperature. Moreover, it may be possible that the semiconductor can be produced by using a solution by suitably improving the molecular structure of the compound so that the production by a printing process including an ink-jet method can be realized by making the organic semiconductor solution to an ink. Though it may impossible to produce the semiconductor element by such the low temperature process by using the usual silicon type semiconductor material, it may be possible with respect to the device employing the organic semiconductor. Therefore, the limitation on the heat resistivity of the substrate is alleviated and, for example, the TFT element may be possible to be formed on a transparent resin substrate plate. When the TET elements can be formed on the transparent resin substrate plate and the displaying materials can be drove by the TFT elements, the display will be made to one lighter in the weight, higher in the flexibility than those of the usual one and is hardly or difficultly broken by falling.

However, the organic semiconductors studied for realizing such the TFT element are only limited kinds of compound, for example, an acene-type compound such as pentacene and anthracene (cf., for example, Patent Document 1), a phthalocyanine including lead phthalocyanine, a low molecular weight compound such as perylene and its tetracarboxylic acid derivative (cf., for example, Patent Document 2), an aromatic oligomer typically such as a hexamer of thiophene so-called as α-thienyl or sexithiophnen (cf., for example, Patent Document 3), a compound of naphthalene or anthracene symmetrically condensed with a 5-member aromatic heterocyclic ring (cf., for example, Patent Document 4), a mono-, oligo- and poly-thienylenopyridine (cf., for example, Patent Document 5) and a conjugate polymer such as polythiophene, poly(thienylene vinylene) and poly(p-phenylene vinylene). Accordingly, development of a semiconductor composition employing a novel charge transferable material showing high carrier mobility is demanded. Japanese Patent Tokkai 2003-292588, U.S. Patent Opened Application Nos. 2003/13658, 2003/160230 and 2003/164495 describe as follows. "The mechanical strength of a logical integrated circuit element for microelectronics is largely improved and the using life time of it can be prolonged by employing a polymer TFT. However, the polythiophene semiconductors are mostly instable in air because which is doped by oxygen in the atmosphere so that the electro conductance of it is increased. As a result of that, the off current of the device produced from such the materials is increased, and the on/off ratio of the electric current is decreased. Therefore, the materials cause problems of that the materials should be exactly controlled so as to prevent the oxidation doping or to minimize the effect of the oxidation doping during the processing of the materials and the production of the device by eliminating the oxygen in the atmosphere. Consequently, an electronic device is demanded, which has high resistivity against oxygen and shows relatively high ON/OFF ratio of the electric current." And the various means for resolving such the problem are proposed (for example, cf. Patent Documents 6 to 11 and Non Patent Document 4). However, the level of the improvement is insufficient and further improvement is desired.

Patent Document 1: Tokkai Hei 5-55568
Patent Document 2: Tokkai Hei 5-190877
Patent Document 3: Tokkai Hei 8-264805

Patent Document 4: Tokkai Hei 11-195790
Patent Document 5: Tokkai 2003-155289
Patent Document 6: Tokkai 2003-261655
Patent Document 7: Tokkai 2003-264327
Patent Document 8: Tokkai 2003-268083
Patent Document 9: Tokkai 2004-186695
Patent Document 10: Tokkai 2003-264327
Patent Document 11: Tokkai 2003-268083
Non-patent Document 1: "Science" vol. 289, p. 599, (2000)
Non-patent Document 2: "Nature" vol. 403, p. 521, (2000)
Non-patent Document 3: "Advanced Material" 2002, No. 2, p. 599, (2000)
Non-patent Document 4: "J. Am. Chem. Soc." 126, 11, 3378 (2004)

DISCLOSURE OF THE INVENTION

Problems to be Solved by the Invention

An object of the invention is to provide an organic thin film transistor having both of high carrier mobility and high durability.

Effect of the Invention

An organic thin film transistor having both of high carrier mobility and high durability can be provided by the invention.

PREFERABLE EMBODIMENT OF THE INVENTION

Figure 1:
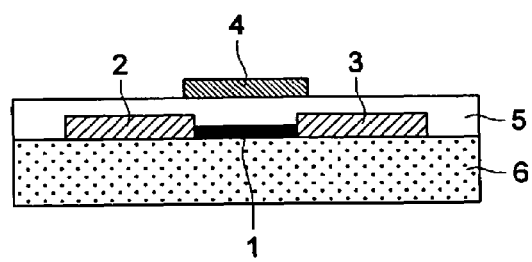
FIG. 1 shows an example of the constitution of the organic thin film transistor relating to the invention.
Figure 1:
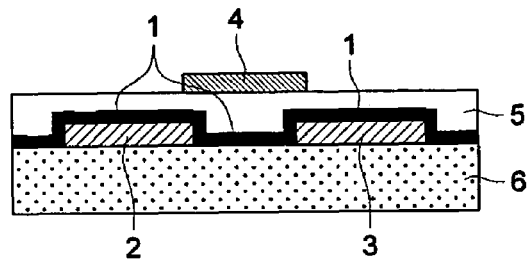
Figure 1:
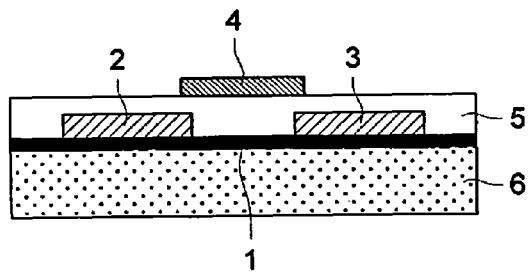
Figure 1:
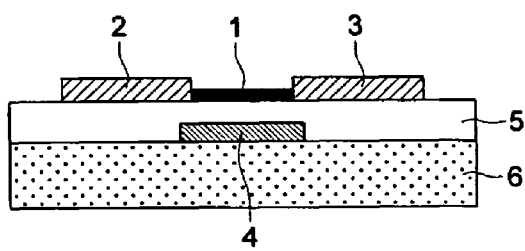
Figure 1:
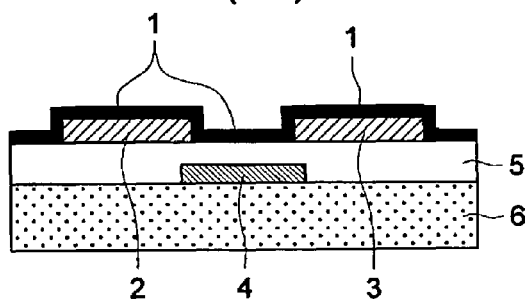
Figure 1:
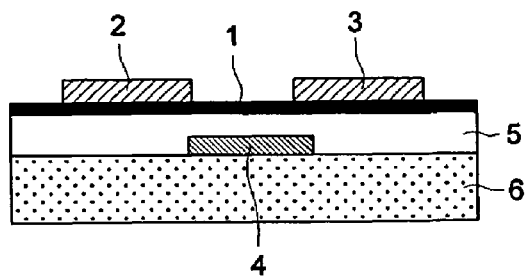

An organic thin film transistor, hereinafter referred to as an organic TFT, having the constitution described in one of claims 1 through 6 shows superior transistor properties such as high carrier mobility and good ON/OFF property and further has high durability.

It is known that molecules of usually known pentacene are regularly oriented since which has strong intermolecular aggregation force and high crystallinity. It is reported that a high carrier mobility and superior semiconductor device properties can be obtained by such the reason. Pentacene causes, however, a problem that the layer is difficultly formed by coating since pentacene is insoluble or slightly soluble in an organic solvent.

The thiophene oligomer having no substituent such as unsubstituted sexithiophene forms a π-stuck between the molecules and tends to form a regularly oriented structure. But the compound is difficultly coated since it is insoluble or slightly soluble in the organic solvent similar to pentacene.

A thiophene oligomer having no substituent typically such as unsubstituted sexithiophene also tends to form a regularly oriented structure by forming a π-stack between the molecules. However, it is insoluble or difficultly solvable and difficult to be coated.

On the other hand, a thiophene oligomer typically such as P3HT is soluble in an organic solvent so as to be form a layer by a coating or ink-jet method. However, the polymer having wide molecular weight distribution insufficiently for the π-stack and has many portions having irregular molecular orientation. Therefore, sufficient carrier mobility and ON/OFF ratio cannot be obtained.

The compound of the invention has both of a soluble moiety of a thiophene ring having a substituent and a moiety of continued unsubstituted thiophene rings accelerating the formation of π-stack so that the a layer having highly oriented molecular structure can be while holding sufficient solubility in the solvent. Moreover, it is found that the orientating ability of the molecules can be further raised by controlling the molecular weight into a certain range. Thus an organic TFT having sufficient TFT characteristics can be obtained by using such the material.

The organic semiconductor material relating to the organic thin film transistor of the invention can be coated since it has sufficient solvent-solubility. Accordingly, the organic TFT according to the invention can be produced by a low temperature process and low cost. Thus the transistor can be easily produced with low coast.

The constituting matters relating to the invention are each described in detail below.

<<Thiophene Oligomer>>

Thiophene oligomer relating to the invention is described below.

The thiophene oligomer relating to the invention has a thiophene ring having a substituent and a partial structure which includes at least two unsubstituted thiophene rings each bonded with together, and the number of thiophene rings containing in the molecule is from 3 to 40, preferably from 3 to 20, and more preferably from 4 to 10.

<<Thiophene Oligomer Represented by Formula 1>>

The thiophene oligomer represented by Formula 1 relating to the invention is described below.

Among the above-mentioned embodiments of the thiophene oligomer, particularly preferable embodiment is that the thiophene oligomer has the partial structure represented by Formula 1.

In Formula 1, the substituent represented by R is, for example, an alkyl group such as a methyl group, an ethyl group, a propyl group, an iso-propyl group, a tert-butyl group, a pentyl group, a hexyl group, an octyl group, a dodecyl group, a tridecyl group, a tetradecyl group and a pentadecyl group; a cycloalkyl group such as a cyclopentyl group and a cyclohexyl group; an alkenyl group such as a vinyl group and an allyl group; alkynyl group such as an ethynyl group and a propalgyl group; an aromatic hydrocarbon group such as a phenyl group, a parachlorophenyl group, a mesityl group, a xylyl group, a naphthyl group, an anthryl group, an azulenyl group, an acenaphthenyl group, a fluorenyl group, a phenanthryl group, an indenyl group, a pyrenyl group and a biphenylyl group; an aromatic heterocyclic group such as a pyridyl group, a pyrimidinyl group, a furyl group, pyrrolyl group, an imidazolyl group, a benzimidazolyl group, a pyrazolyl group, a pyrazinyl group, a triazolyl group, for example, a 1,2,4-triazolyl-1-yl group and 1,2,3-triazolyl-1-yl group, an oxazolyl group, a benzoxyazolyl group, a thiazolyl group, an iso-oxazolyl group, an iso-thiazolyl group, a furazanyl group, a thienyl group, a quinolyl group, a benzofuryl group, a dibenzofuryl group, a benzothienyl group, a dibenzothienyl group, an indolyl group, a carbazolyl group, carbonylyl group, a diazacarbazolyl (a ring in which a carbon atom constituting a carboline ring is replaced by a nitrogen atom), quinoxalinyl group, a pyridazinyl group, a triazinyl group, a quinazolinyl group and a phthalazinyl group; a heterocyclic group such as a pyrrolidyl group, an imidazolidyl group, a morphoryl group and a oxazolidyl group; an alkoxyl group such as a methoxyl group, an ethoxyl group, a poryloxyl group, a pentyloxyl group, a hexyloxyl group, an octyloxyl group and dodecyloxyl group; a cycloalkoxyl group such as cyclopentyloxyl group and a cyclohexyloxyl group; an aryloxyl group such as a phenyloxyl group and a naphthyloxyl group; an alkylthio group such as a methylthio group, an ethylthio group, a propylthio group, a pentylthio group, a hexylthio group, an octylthio group and a dodecylthio group; a cycloalkylthio group such as a cyclopentylthio group and a cyclohexylthio group; an arylthio group such as a phenylthio group, and a naphthylthio group; an alkoxycarbonyl group such as a methyloxycarbonyl group, an ethyloxycarbonyl group, a butyloxycarbonyl group, an octyloxycarbonyl group and a dodecyloxycarbonyl group; an aryloxycarbonyl group such as a phenyloxycarbonyl group and a naphthyloxycarbonyl group; a sulfamoyl group such as an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group and a 2-pyridylaminosulfonyl group; an acyl group such as an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a nephthylcarbonyl group and a pyridylcarbonyl group; an acyloxyl group such as an acetyloxyl group, an ethylcarbonyloxyl group, a butylcarbonyloxyl group, an octylcarbonyloxyl group, a dodecylcarbonyloxyl group and a phenylcarbonyloxyl group; amido group such as a methylcarbonylamino group, qn ethylcarbonylamino group, a dimethylcarbonylamino group, a propylcarbonylamino group, a penylcarbonylamino group, a cyclohexylcarbonylamino group, a 2-ethylhexylcarbonylamino group, an octylcarbonylamino group, a dodecylcarbonylamino group, a phenylcarbonylamino group and a naphthylcarbonylamino group; a carbamoyl group such as an aminocarbonyl group, a methylaminocarbonyl group, a dimethylaminocarbonyl group, a propylaminocarbonyl group, a pentylaminocarbonyl group, a cyclohexylaminocarbonyl group, an actylaminocarbonyl group, a 2-ethylhexylaminocarbonyl group, a dodecylaminocarbonyl group, a phenylaminocarbonyl group, a nephthylaminocarbonyl group and a 2-pyridylaminocarbonyl group; a ureido group such as a methylureido group, an ethylureido group, a pentylureido group, a cyclohexylureido group, an octylureido group, a dodecylureido group, a phenylureido, a naphthylureido group and a 2-pyridylaminoureido group; a sulfinyl group such as a methylsulfinyl group, an ethylsulfinyl group, a butylsulfinyl group, a cyclohexylsulfinyl group, a 2-ehtylhexylsulfinyl group, a dodecylsulfinyl group, a phenylsulfinyl group, a naphthylsulfinyl group and a 2-pyridylsulfinyl group; an alkylsulfonyl group such as a methylsulfonyl group, an ethylsuofonyl group, a butylsulfonyl group, a cyclohexylsulfonyl group, a 2-ethylhexylsulfonyl group and a dodecylsufonyl group; an arylsulfonyl group such as a phenylsulfonyl group, a naphthylsulfonyl group and a 2-pyridylsulfonyl group; an amino group such as an amino group, an ethylamino group, a dimethylamino group, a butylamino group, a cyclopentylamino group, a 2-ethylhexylamino group, a dodecylamino group, an anilino group, a naphthylamino group and a 2-pyridylamino group; a halogen atom such as a fluorine atom, a chlorine atom and a bromine atom; a fluorohydrocarbon group such as a fluoromethyl group, a trifluoromethyl group, a pentafluoroethyl group and a pentafluorophenyl group; a cycano group; or a silyl group such as a trimetylsilyl group, a triisopropylsilyl group, and a phenyldiethylsilyl group.

These substituents are each allowed to further have the above-mentioned group as the substituent and to form a ring by bonding with together.

R is preferably an alkyl group, and more preferably an alkyl group containing from two to twenty carbon atoms, and most preferably an alkyl group containing from six to twelve carbon atoms.

The thiophene oligomer relating to the invention has a thiophene ring having a substituent and a partial structure which includes at least two unsubstituted thiophene rings each bonded with together, may be further contained an aromatic hydrocarbon ring or an aromatic heterocyclic ring except for thiophene ring.

Examples of the aromatic hydrocarbon ring include a benzene ring, a biphenyl ring, a naphthalene ring, an azulene ring, an anthracene ring, a phenanthrene ring, a pyrene ring, a crycene ring, a naphtacene ring, a triphenylene ring, an terphenyl ring, a m-terphenyl ring, a p-terphenyl ring, an acenaphthene ring, a cronene ring, a fluorene ring, a fluoranthrene ring, a naphthacene ring, a pentacene ring, a perylene ring, a pentaphene ring, a picene ring, a pyrene ring, a pyranthrene ring and an anthranthrene ring. The hydrocarbon rings each may have the foregoing substituent.

Examples of the aromatic heterocyclic ring include a furan ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, an indazole ring, a benzimidazole ring, a benzothiazole ring, a benzoxazole ring, a quinoxaline ring, a quinazoline ring, a cinnoline ring, a quinoline ring, an isoquinoline ring, a phthalazine ring, a naphthylizine ring, a carbazole ring, a carboline ring and diazacarbazole ring (a ring in which a carbon atom constituting a carboline ring is replaced by a nitrogen atom). The aromatic heterocyclic rings may have each the foregoing substituent.

<<Terminal Group of Thiophene Oligomer>>

The terminal group of the thiophene oligomer relating to the invention is described below.

It is preferable that the terminal group of the thiophene oligomer relating to the invention has no thienyl group. Examples of preferable terminal group include an aryl group such as a phenyl group, a p-chlorophenyl group, a mesityl group, a tolyl group, a xylyl group, a naphthyl group, an anthoryl group, an azulenyl group, an acenaphthenyl group, a fluorenyl group, a phenanthoryl group, an indenyl group, a pyrenyl group and a biphenylyl group; an alkyl group such as a methyl group, an ethyl group, a propyl group, an iso-propyl group, a tert-butyl group, a pentyl group, a hexyl group, an octyl group, a dodecyl group, a tridecyl group, a tetradecyl group and a pentadecyl group; and a halogen atom such as a fluorine atom, a chlorine atom and a bromine atom.

<<Steric Properties of Repeating Unit of Thiophene Oligomer>>

It is preferable that the thiophene oligomer relating to the invention has no Head-to-Head structured in the molecular structure thereof. The presence of a Head-to-Tail or Tail-to-Tail structure in the molecular is more preferable.

Regarding the Head-to-Head, Head-to-Tail and Tail-to-Tail Structures, for example, "π-denshi-kei yuuki Kotai (Π-electron type Organic Solid)" edited by Nihon Kagakukai, Gakkai Shuppan Center, 1998, and "Adv. Mater. 10., No. 2, pp. 93-116, 1998, can be referred. The structural properties of each of these structures are described below.

Head-to-Head Structure
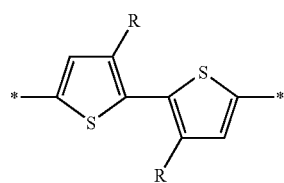
Head-it-Tail Structure
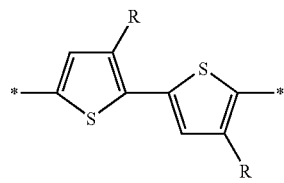
Tail-to-Tail Structure
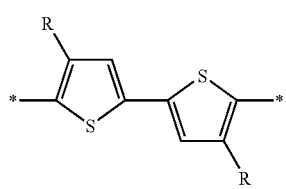
Concrete examples of the thiophene oligomer relating to the invention are listed below. The embodiment of the invention is not limited to the examples.
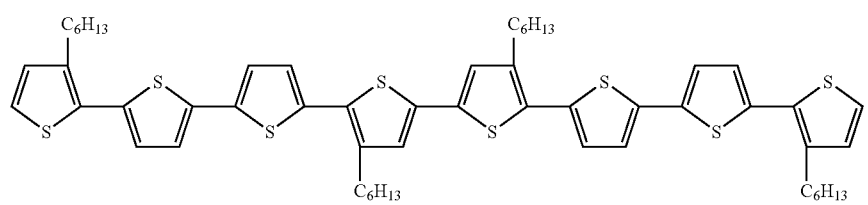
<1>
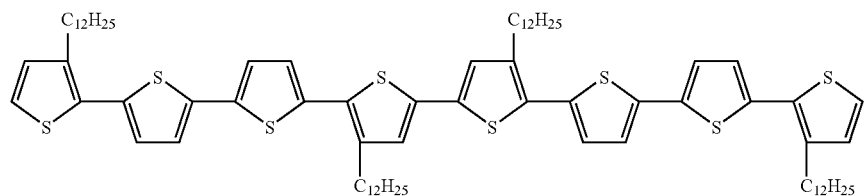
<2>
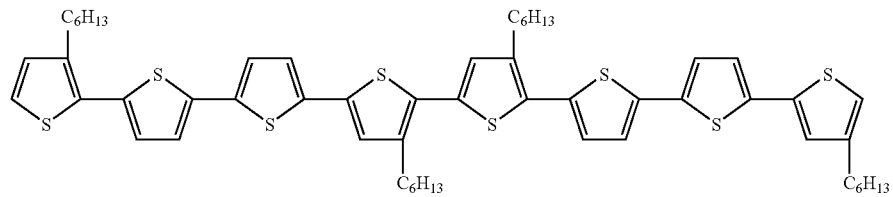
<3>
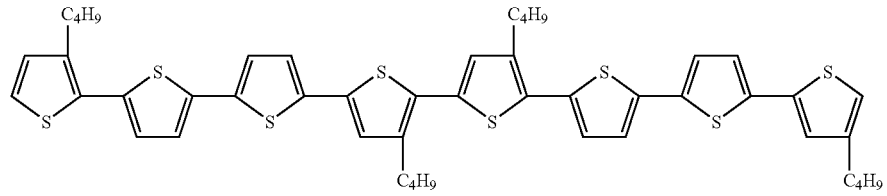
<4>
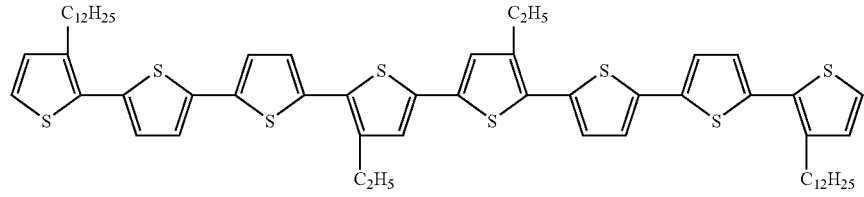
<5>

-continued
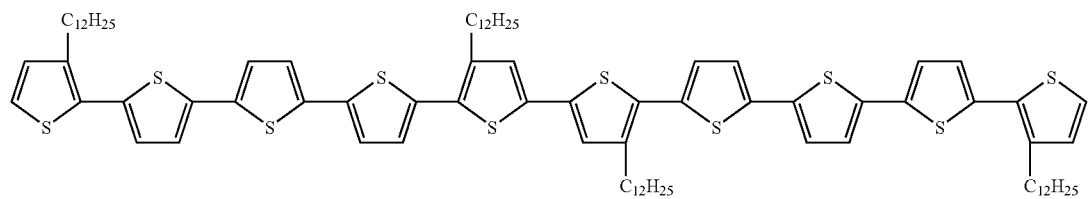
<6>
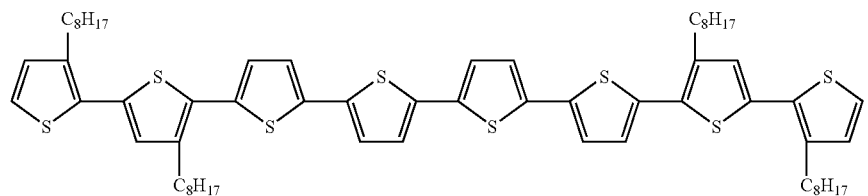
<7>
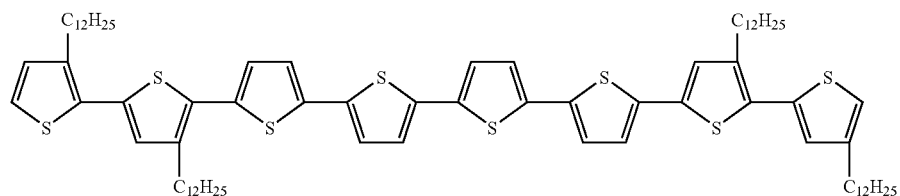
<8>
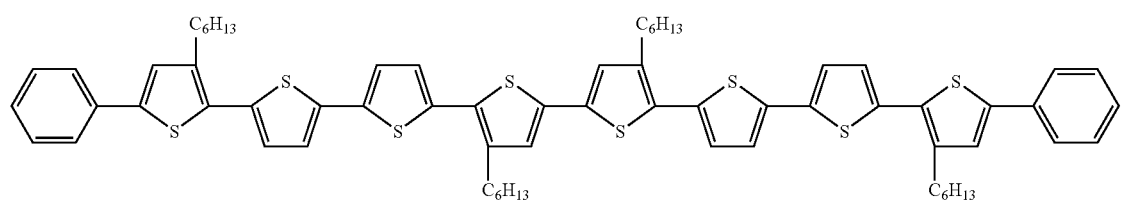
<9>
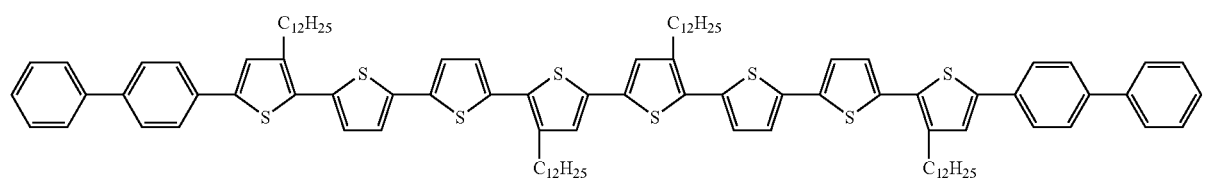
<10>
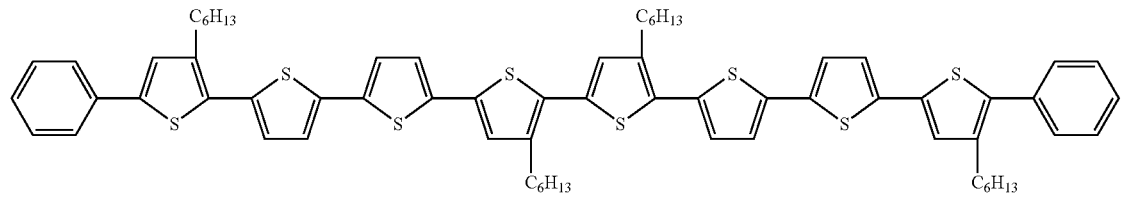
<11>
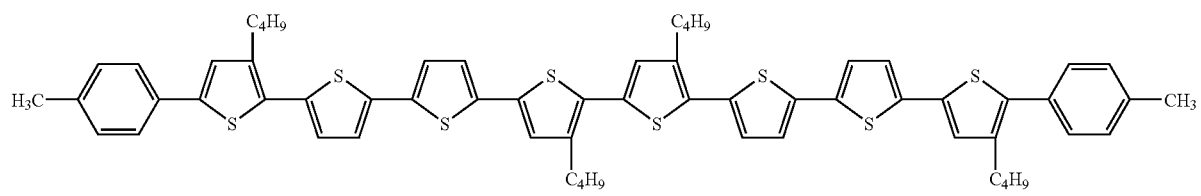
<12>
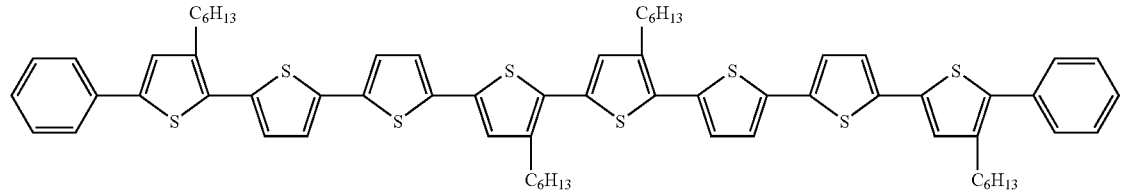
<13>

-continued
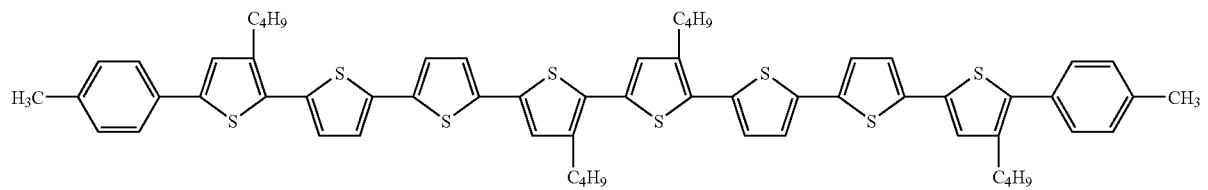
<14>
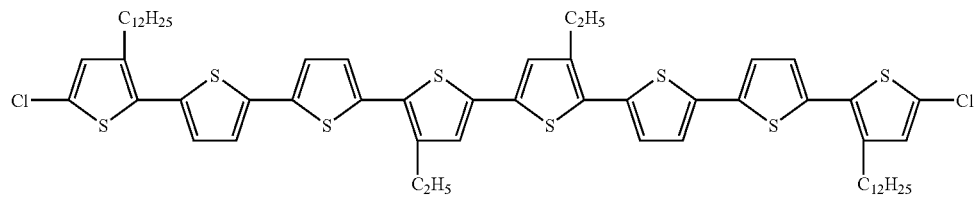
<15>
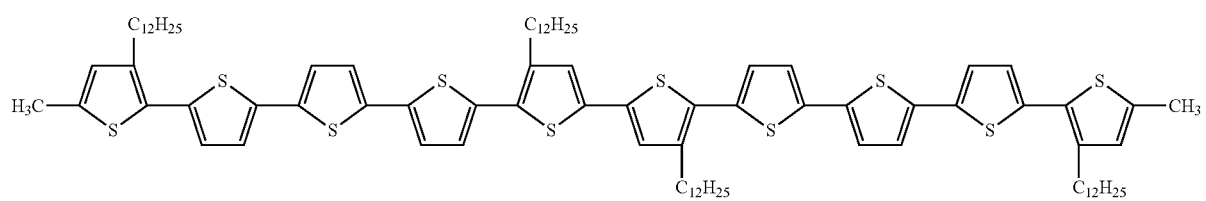
<16>
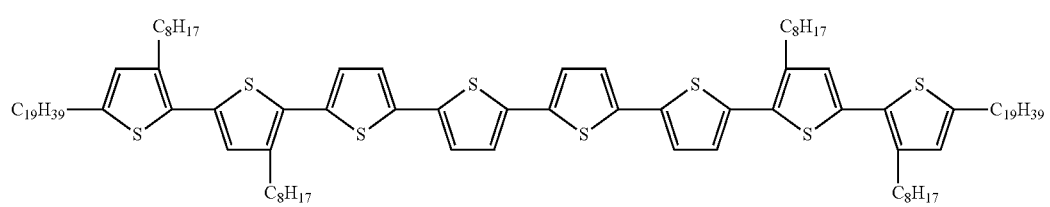
<17>
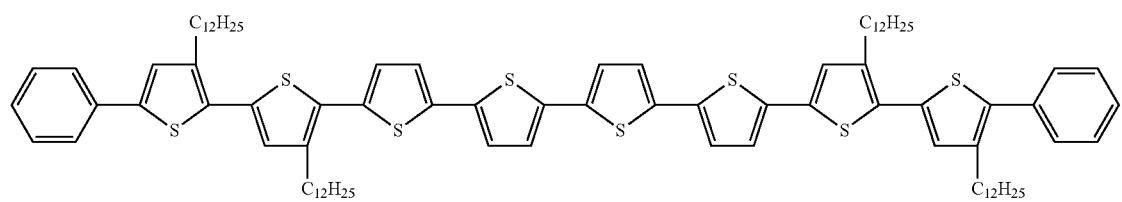
<18>
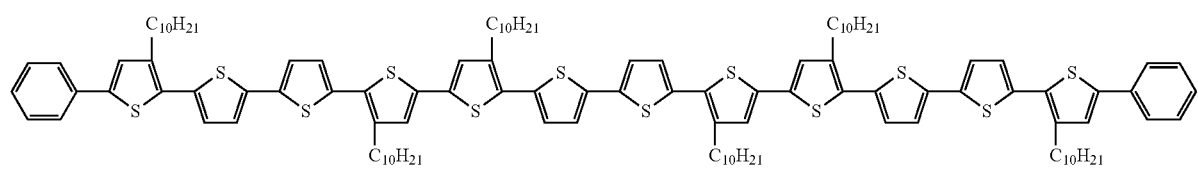
<19>
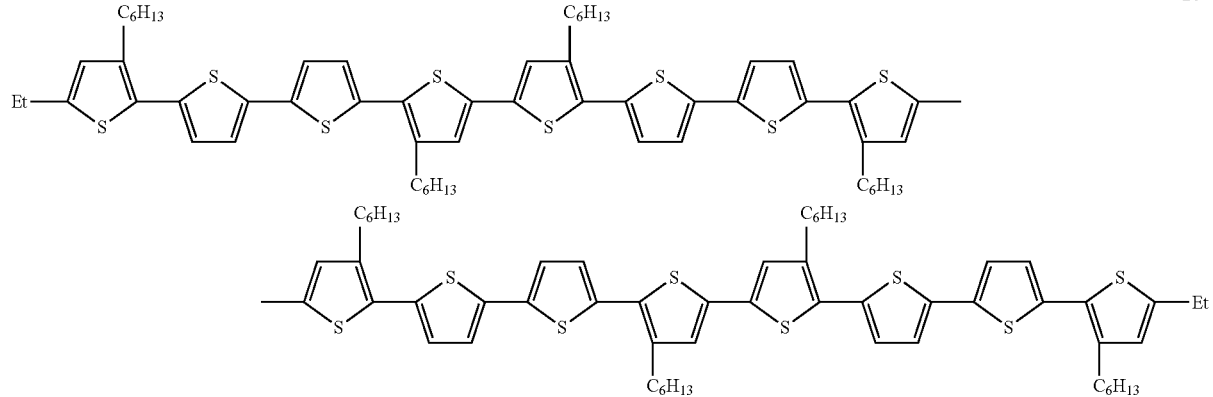
<20>

-continued
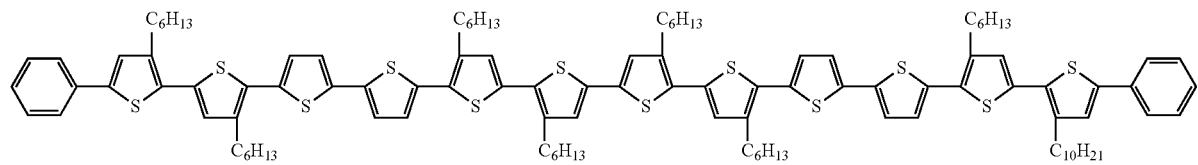
<21>
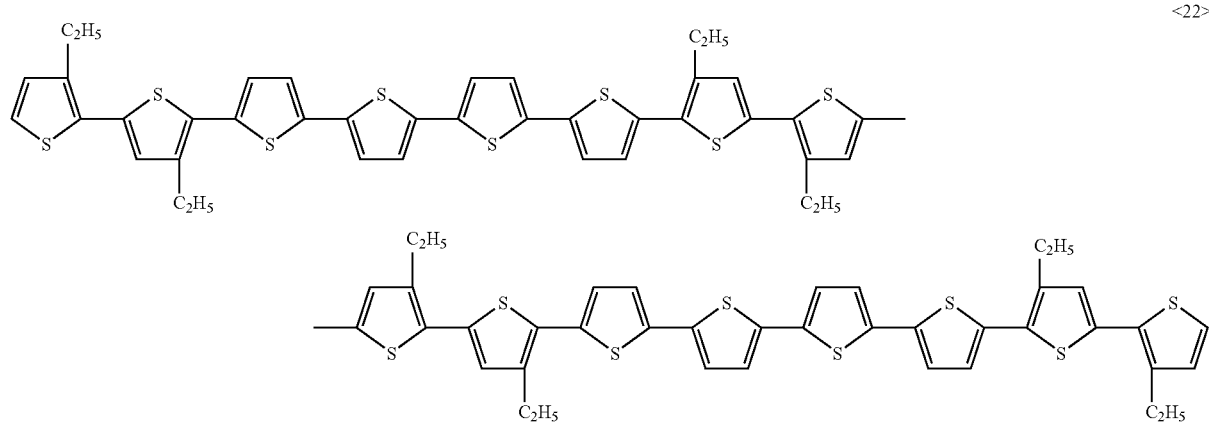
<22>
<23>
<24>
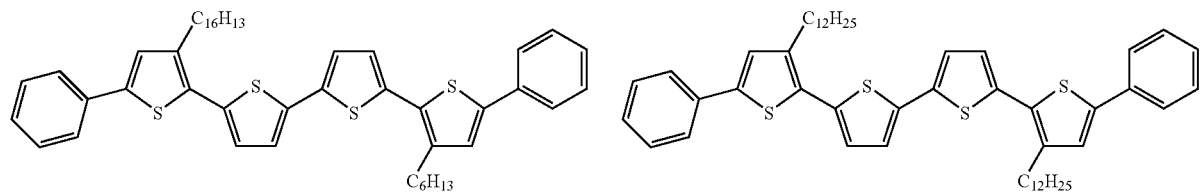
<25>
<26>
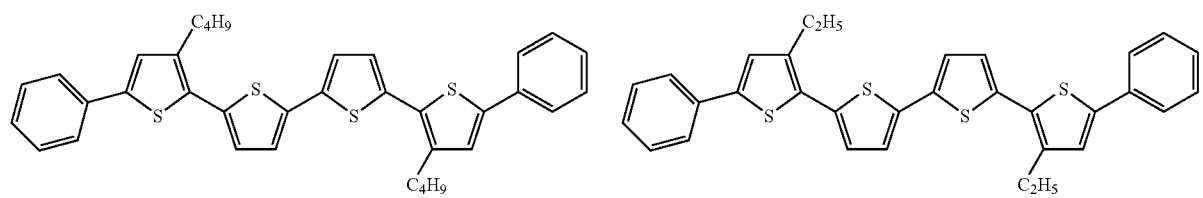
<27>
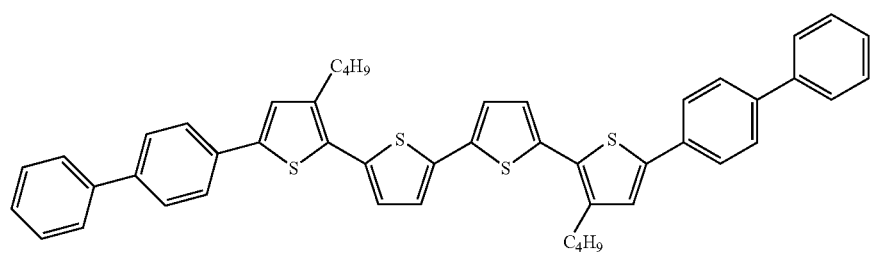
<28>
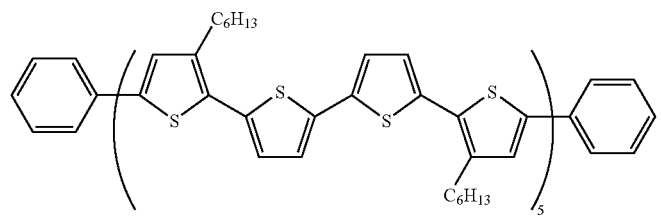

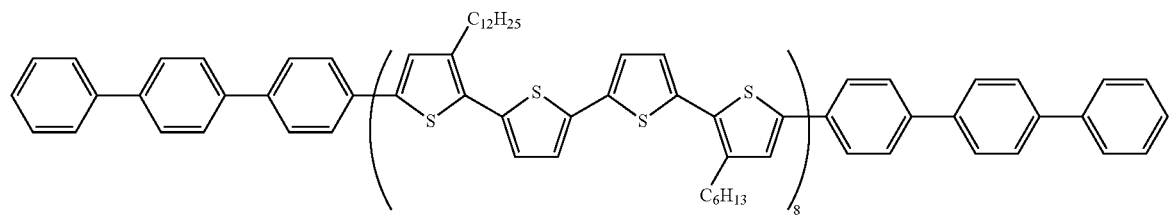

<29>

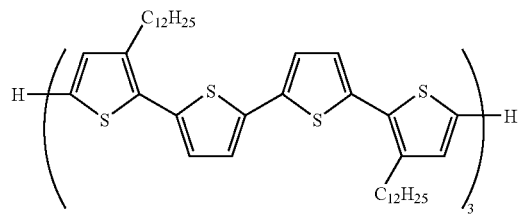

<30>

An example of synthesis of the thiophene oligomer relating to the invention is described below. The thiophene oligomer relating to the invention can be synthesized referring a known method.

<<Synthesis of Compound 9>>

Intermediate 2 was synthesized as followings and then Compound 9 was prepared from Intermediate 2.

Synthesis Example

The solution was stirred for 3 hours under reflux and the reacted mixture was cooled to room temperature and washed by a 5 weight percent aqueous solution of potassium hydroxide, water and a saturated solution of sodium chloride. After removing the solvent by distillation, the object material was isolated by column chromatography. Thus 3.8 g of Intermediate 2 was obtained in a yield of 55%.

Synthesis of Compound 9

In a nitrogen atmosphere, 1.2 g of Intermediate 2, 0.5 g of phenylboric acid, 0.3 g of tetrakis(triphenylphosphine)palla-

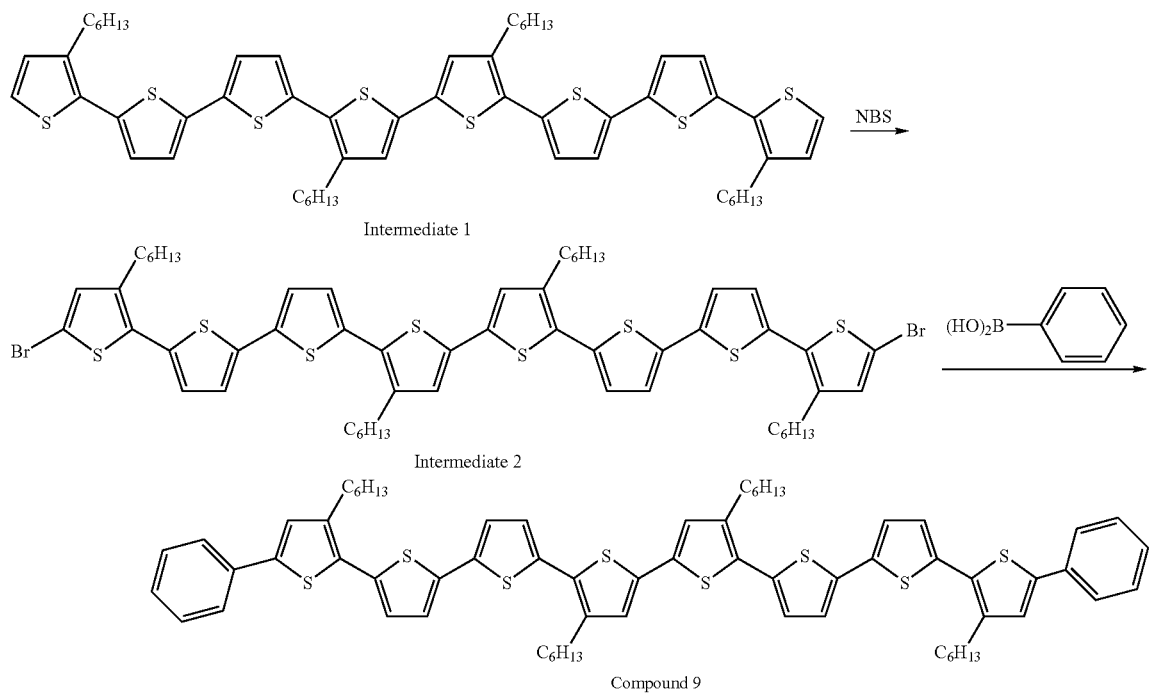

Synthesis of Intermediate 2

Six grams of Intermediate 1 synthesized according to the description of "J. Phys. Chem." 99, 10, 1996, 3218-3224 was dissolved in a mixture solvent composed of 240 ml of dichloromethane and 120 ml of acetic acid and 2 g of N-bromosuccinimide was added separately into several parts.

dium(0) and 1 ml of 20 weight percent aqueous solution of potassium carbonate were added to 40 ml of THF and stirred for 70 hours under reflux. Thus obtained reacted mixture was washed water and a saturated solution of sodium chloride and the solvent was removed by distillation, and then 0.4 g of Compound 9 was obtained by column chromatography in a yield of 36%. The molecular structure of thus obtained Compound 9 was subjected to measurement of $^1$H-NMR (nuclear magnetic resonance spectrum) and mass spectrum and it was confirmed that the compound was the objective substance. Moreover, it was confirmed by HPLC measurement that the purity of the compound is not less than 99%.

Compounds other than Compound 9 can be synthesized in a manner similar to that in the synthesis of Compound 9.

<<Organic Thin Film Transistor (also Referred to as Organic TFT>>

The organic thin film transistor (organic TFT) of the invention is described below.

A suitably functioning organic thin film transistor (organic TFT) can be provided by the use of the thiophene oligomer according to the invention. The organic TFT (organic thin film transistor) can be roughly classified into a top-gate type and a bottom-gate type. The top-gate type has a source electrode and a drain electrode which are connected with together by an organic semiconductor channel of a semiconductor layer on a substrate and a gate electrode is provided over them through a gate isolating layer. The bottom-gate type has a gate electrode on a substrate and a source electrode and a drain electrode which are connected by an organic semiconductor channel are provided thereon through a gate isolating layer.

For providing the thiophene oligomer as the semiconductor layer of the organic TFT, it is preferable that a solution which is prepared by dissolving the thiophene oligomer in a suitable solvent and adding an additive according to necessity is provided on the substrate by a method such as a cast coating method, a spin coating method, a printing method, an ink-jetting method and an ablation method, even though the provision can be performed by a vacuum deposition.

In such the case, the solvent for dissolving the organic semiconductor relating to the invention is not specifically limited as long as the solvent can dissolve the organic semiconductor for obtaining a solution having a suitable concentration. Concrete examples of the solvent include a chain-formed ether solvent such as diethyl ether and di-iso-propyl ether; a cyclic ether solvent such as tetrahydrofuran and dioxane; a ketone solvent such as acetone and methyl ethyl ketone; a halogenized alkyl type solvent such as chloroform and 1,2-dichloroethane, an aromatic solvent such as toluene, o-dichlorobenzene, nitrobenzene and m-cresol, N-methylpyrrolidone and carbon disulfide.

In the invention, the material for constituting the source electrode, drain electrode and gate electrode is not specifically limited as long as the material is electroconductive. Examples of usable material include platinum, gold, silver, nickel, chromium, copper, iron, tin, antimony, lead, tantalum, indium, palladium, tellurium, rhenium, iridium, aluminum, ruthenium, germanium, molybdenum, tungsten, tin·antimony oxide, indium·tin oxide (ITO), fluorine-doped zinc oxide, zinc, carbon, graphite, glassy carbon, silver past, carbon paste, lithium, beryllium, sodium, magnesium, potassium, calcium, scandium, titanium, manganese, zirconium, gallium, niobium, a sodium-potassium alloy, a magnesium/copper mixture, a magnesium/silver mixture, a magnesium/aluminum mixture, a magnesium/indium mixture, an aluminum/aluminum oxide mixture and a lithium/aluminum mixture. Platinum, gold, silver, copper, aluminum, indium, ITO and carbon are preferable. A known electroconductive polymer increased in the electroconductivity by doping such as electroconductive polyaniline, electroconductive polypyrrol and electroconductive polythiophnen, and a complex of polyethylenedioxythiophene and polyethylene sulfonic acid are also preferably usable. Among them, one displaying low electric resistance at the contacting surface with the semiconductor layer is preferred.

The following methods are applicable for forming the electrodes; a method in which a electroconductive thin layer prepared by evaporation depositing or spattering the foregoing material is formed into the electrode by a known photolithographic method or a lift-off method, and a method in which a resist is provided on a foil of metal such as aluminum and copper by a thermal transfer or ink-jet and the metal foil is subjected to etching. Moreover, the electrodes may be formed by directly patterning the solution or the dispersion of fine particles of the electroconductive polymer by an ink-jet method, or by lithographing or laser ablation the coated layer. Furthermore, a method can be applied, in which electroconductive polymer, an ink containing electroconductive fine particles or an electroconductive paste is patterned by a printing method such as relief printing, intaglio printing, lithographic printing and screen printing.

For the gate isolating layer an inorganic oxide layer having high specific permittivity is preferred even though various kinds of layers can be employed. As the inorganic oxide, for example, silicon oxide, aluminum oxide, tantalum oxide, titanium oxide, tin oxide, vanadium oxide, barium strontium titanate, barium zirconate titanate, lead zirconium titanate, lead lanthanum titanate, strontium titanate, barium titanate, barium magnesium fluoride, bismuth titanate, strontium bismuth titanate, strontium bismuth tantalite and yttrium trioxide are employable. Among the above, silicon oxide, aluminum oxide, tantalum oxide and titanium oxide are preferable. An inorganic nitride such as silicon nitride and aluminum nitride is also preferably usable. For forming the layer, a dry process such as a vacuum deposition method, a molecular ray epitaxial growing method, an ion cluster beam method, a low energy ion beam method, an ion plating method, a CVD method, a spattering method and an atmospheric pressure plasma method, and a wet process such as a spray coating method, a spin coating method, a blade coating method, a dip coating method, a casting method, a roller coating method, a bar coating method, a die coating method and a patterning by printing or ink-jetting are applicable. These methods can be selected corresponding to the materials. As the wet process, a method in which a liquid prepared by dispersing fine particles of the inorganic oxide into an optional organic solvent or water employing an dispersing agent, according to necessity, is coated and dried, and a method so called as sol-gel method in which a solution of a precursor such as an alkoxide compound is coated and dried are applicable. Among the above methods, the atmospheric pressure plasma method and the sol-gel method is preferred.

The isolating layer forming method by a plasma layer forming treatment in the atmospheric pressure is a treatment by excited plasma of a reactive gas generated by discharging in atmospheric pressure or near atmospheric pressure for forming a layer on a substrate; hereinafter this method is also referred to as an atmospheric pressure plasma method. Such the method is described in Japanese Patent Tokkai Hei 11-61406 and 11-133205, Tokkai 2000-12804, 2000-147209 and 2000-185362. By this method, a thin layer superior in the property can be produced with high producing efficiency.

For the organic compound layer the following s are employable; polyimide, polyamide, polyester, polyacrylate, a light radical polymerization type and light-cation polymerization type light-hardenable resins, a copolymer containing acrylonitrile component, polyvinylphenol, poly(vinyl alcohol), novolac resin and cyanoethylpullulan. For forming the organic layer, the foregoing wet method is preferable. The inorganic compound layer and the organic compound layer can be employed in combination in a laminated form. The thickness of the layer is usually from 50 nm to 3 µm, and preferably from 100 nm to 1 µm.

The substrate is constituted by glass or flexible resin sheet, and a plastic film can be employed as the sheet. Examples of the plastic film include a film of poly(ethylene terephthalate) (PET), poly(ethylene naphthalate) (PEN), polyethersulfon (PES), polyetherimide, poly(ether ether ketone), poly(phenylene sulfide), polyallylate, polyimide, polycarbonate (PC), cellulose triacetate (TAC) and cellulose acetate propionate (CAP). By the use of the plastic film, the weight can be made lighter and the portableness and the shock resistivity can be improved compared to the product using the glass substrate.

The organic TFT (including an electric field effect transistor) employing the organic thin layer formed by the organic TFT material of the invention is described below.

FIG. 1 shows an example of the constitution of the organic TFT according to the invention. FIG. 1(a) shows an electric field effect transistor in which a source electrode 2 and a drain electrode 3 are formed on a substrate 6 and an organic semiconductor layer 1 of the organic thin film transistor material according to the invention is provided between the electrodes, and an isolation layer 5 is formed thereon, and a gate electrode 4 is formed on the isolation layer 5 to form the electric field effect transistor. FIG. 1(b) shows one in which the organic semiconductor layer is formed by a coating method so that the layer entirely covers the surface of the electrodes and the substrate; such the layer is formed only between the two electrodes in FIG. 1(a). In FIG. 1(d), the organic semiconductor layer 1 is firstly formed by coating on the substrate 6 and then the source electrode 2, drain electrode 3, the isolation layer 5 and gate electrode 4 are provided.

In FIG. 1(d), the gate electrode 4 of metal foil is formed on the support 6 that then the isolation layer 5 is formed thereon, the source electrode 2 and the drain electrode 3 each formed by the metal foil on the isolation layer, and then the semiconductor layer 1 is formed between the electrodes by the organic thin film transistor material of the invention. Furthermore, the structures shown in FIGS. 1(e) and (f) can be taken.

Figure 2:
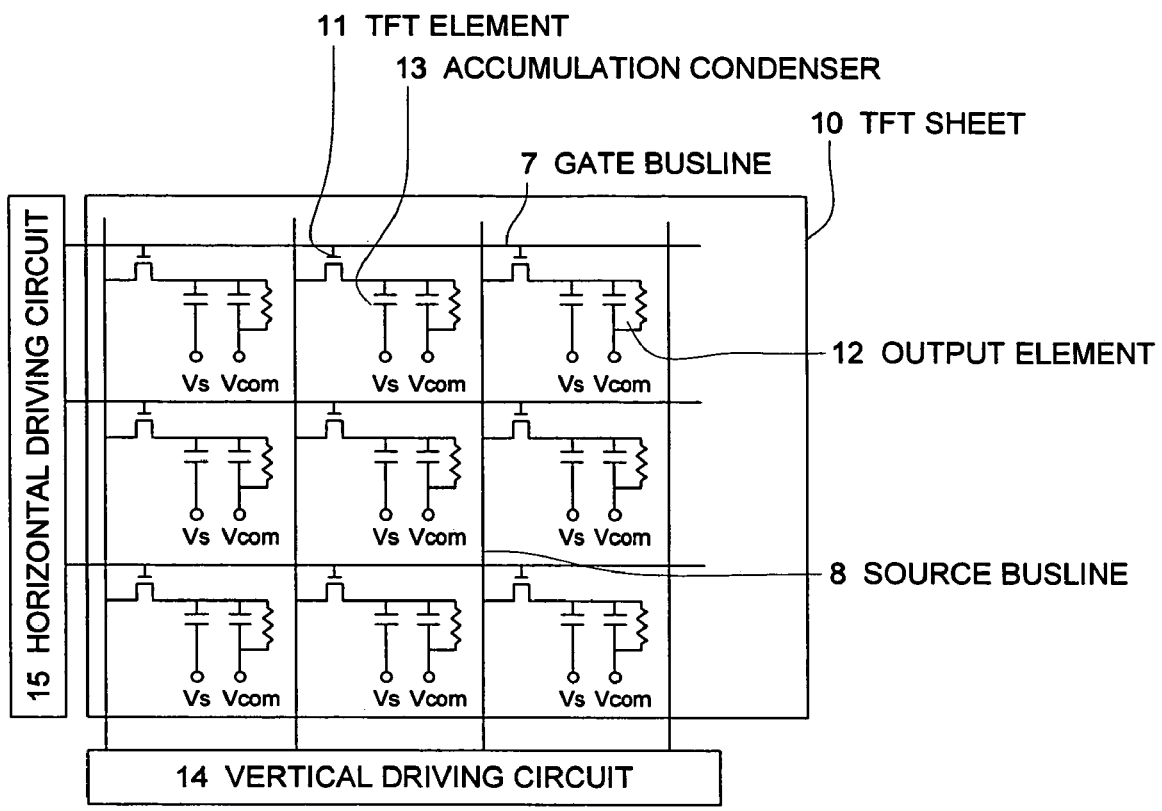
FIG. 2 shows an example of the schematic equivalent circuit drawing of the organic thin film transistor relating to the invention.

FIG. 2 shows an example of schematic equivalent circuit drawing.

The organic TFT sheet 10 includes many organic TFT 11 arranged in a matrix. 7 is the gate busline of each of the TFT 11, and 8 is the source busline of each of the TFT 11. To the source electrode of each of the TFT 11, an output element 12 is connected which is, for example, a liquid crystal or an electrophoretic element constituting the pixel of the displaying apparatus. The pixel electrode may be used as an input electrode of a photo sensor. In the displayed example, the liquid crystal as the output element is shown by an equivalent circuit composed of a resistor and a condenser. 13 is an accumulation condensers 14 is vertical driving circuit and 15 is a parallel driving circuit.

EXAMPLES

The invention is described below referring examples; the invention is limited to the examples.

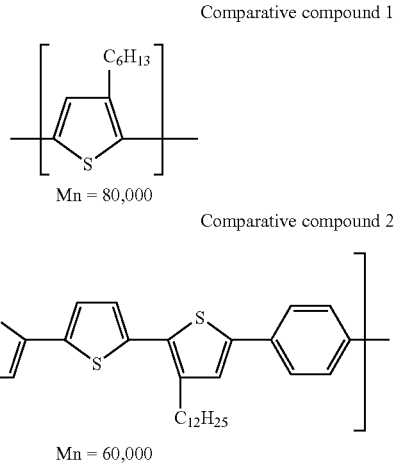

Comparative compound 1, Comparative compound 2

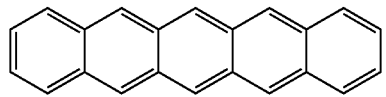

Comparative compound 3

Example 1

<<Preparation of Organic Thin Film Transistor 1>>

Comparative Example

On a Si wafer to be a gate electrode having a specific resistance of 0.02 Ω·cm, a oxide layer having a thickness of 200 nm was formed by heating as a gate isolating layer, and the surface thereof was treated by octadecyltrichlorosilane.

A chloroform solution of the organic semiconductor of Comparative Compound 1 was bubbled by nitrogen gas for removing oxygen dissolved in the solution and coated by an applicator on the surface of the foregoing silicon oxide layer in a nitrogen atmosphere of $1.013 \times 10^2$ kPa to form a casted layer having a thickness of 20 nm. After drying at the room temperature, a heat treatment is provided in $N_2$ gas atmosphere.

A source electrode and a drain electrode were provided on the surface of the layer by evaporation depositing gold using a mask. Thus organic thin film Transistor 1 (comparative sample) having a channel length of 30 μm and a channel width of 1 mm was prepared.

<<Preparation of Organic Thin Film Transistors 2 and 3>>

Comparative Examples

Organic thin film Transistors 2 and 3 were prepared in the same manner as in organic thin film Transistor 1 except that Comparative Compounds 2 and 3 were employed, respectively, in place of Comparative Compound 1.

<<Preparation of Organic Thin Film Transistors 4 through 11>>

Inventive Example

Organic thin film Transistors 4 through 11 (inventive samples) were prepared in the same manner as in organic Transistor 1 except that organic semiconductor materials according to the invention were employed, respectively, in place of Comparative Compound 1. Comparative Compound 3 was pentacene manufactured by Aldrich Co., Ltd., which as used after purification.

Obtained organic thin film Transistors 1 through 11 were subjected to the following evaluations.

<<Evaluation on Carrier Mobility and ON/OFF Ratio>>

The carrier mobility and the ON/OFF ratio of the above obtained organic thin film Transistor 1 through 11 were measured at just after preparation and after standing for 1 month in the atmosphere. The carrier mobility was determined from the saturation region of I-V characteristics and the ON/OFF ratio was determined base on the ratio of the drain current when the drain bias was set at −50 V and the gate bias was set at −50 V and 0 V.

Obtained results are listed in Table 1.

TABLE 1

| Organic TFT element No. | Organic TFT material | Mobility (Just after preparation) (cm²/V sec) | ON/OFF ratio (Just after preparation) | Mobility (After 1 month) (cm²/V sec) | ON/OFF ratio (After 1 month) | Remarks |
|---|---|---|---|---|---|---|
| 1 | Comparative compound 1 | $9.6 \times 10^{-3}$ | $1.2 \times 10^{3}$ | $2.0 \times 10^{-4}$ | $1.1 \times 10^{1}$ | Comp. |
| 2 | Comparative compound 2 | $6.8 \times 10^{-3}$ | $4.2 \times 10^{5}$ | $1.5 \times 10^{-4}$ | $3.2 \times 10^{4}$ | Comp. |
| 3 | Comparative compound 3 | $3.2 \times 10^{-5}$ | $2.2 \times 10^{1}$ | Cannot be measured | Cannot be measured | Comp. |
| 4 | 1 | $5.1 \times 10^{-2}$ | $4.5 \times 10^{5}$ | $4.2 \times 10^{-2}$ | $3.1 \times 10^{5}$ | Inv. |
| 5 | 2 | $4.2 \times 10^{-2}$ | $4.2 \times 10^{5}$ | $3.4 \times 10^{-2}$ | $2.8 \times 10^{5}$ | Inv. |
| 6 | 9 | $4.3 \times 10^{-1}$ | $4.7 \times 10^{5}$ | $3.6 \times 10^{-1}$ | $4.4 \times 10^{5}$ | Inv. |
| 7 | 10 | $2.1 \times 10^{-1}$ | $3.0 \times 10^{5}$ | $1.1 \times 10^{-1}$ | $2.8 \times 10^{5}$ | Inv. |
| 8 | 19 | $6.8 \times 10^{-2}$ | $4.8 \times 10^{4}$ | $4.9 \times 10^{-2}$ | $4.2 \times 10^{4}$ | Inv. |
| 9 | 23 | $4.0 \times 10^{-1}$ | $3.6 \times 10^{5}$ | $3.0 \times 10^{-1}$ | $3.0 \times 10^{5}$ | Inv. |
| 10 | 27 | $3.7 \times 10^{-1}$ | $2.4 \times 10^{5}$ | $3.2 \times 10^{-1}$ | $2.3 \times 10^{5}$ | Inv. |
| 11 | 30 | $4.3 \times 10^{-2}$ | $2.4 \times 10^{4}$ | $3.7 \times 10^{-2}$ | $2.3 \times 10^{4}$ | Inv. |

It is understood that the organic thin film Transistors 4 through 11 are superior in the transistor characteristics to those of the comparative organic thin film Transistors 1 through 3 at just after the preparation and has high durability since the degradation in the passing of the time is small.

What is claimed is:

1. An organic thin film transistor comprising a semiconductor layer containing a thiophene oligomer which has a thiophene ring having a substituent and a partial structure constituted by directly connected two or more thiophene rings each having no substituent, and contains three to forty thiophene rings per molecule, wherein the thiophene oligomer has a partial structure represented by the following Formula 1,

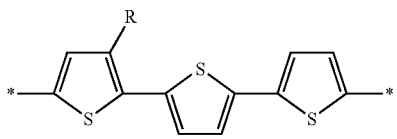

wherein R is a substituent; and each terminal group of the thiophene oligomer is an aromatic hydrocarbon group.

2. The organic thin film transistor of claim 1, wherein the thiophene oligomer has no Head-to-Head structure.

3. The organic thin film transistor of claim 1, wherein the number of the thiophene ring in the molecule of the thiophene oligomer is from three to twenty.

4. The organic thin film transistor of claim 3, wherein the number of the thiophene ring in the molecule of the thiophene oligomer is from four to ten.

5. The organic thin film transistor of claim 1, wherein the number of the thiophene ring in the molecule of the thiophene oligomer is from three to twenty.

6. The organic thin film transistor of claim 5, wherein the number of the thiophene ring in the molecule of the thiophene oligomer is from four to ten.

7. The organic thin film transistor of claim 2, wherein the number of the thiophene ring in the molecule of the thiophene oligomer is from three to twenty.

8. The organic thin film transistor of claim 7, wherein the number of the thiophene ring in the molecule of the thiophene oligomer is from four to ten.

9. The organic thin film transistor of claim 1, wherein the thiophene oligomer is selected from the group consisting of:

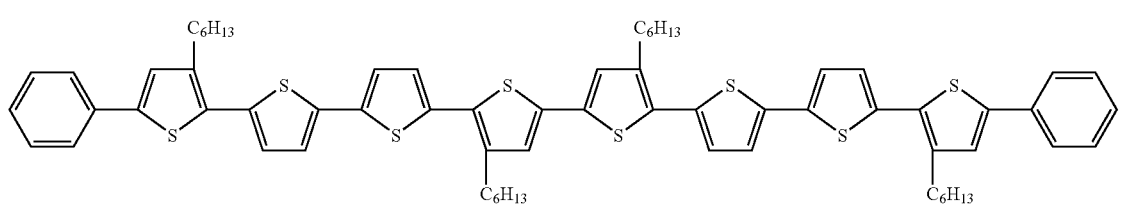

<9>

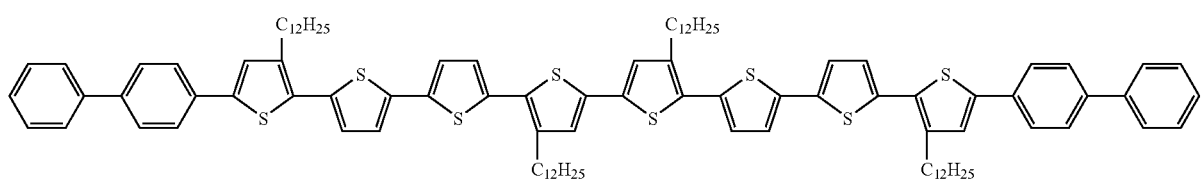

<10>

-continued
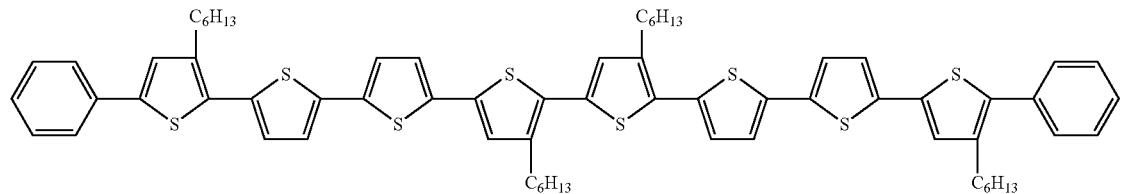
<11>
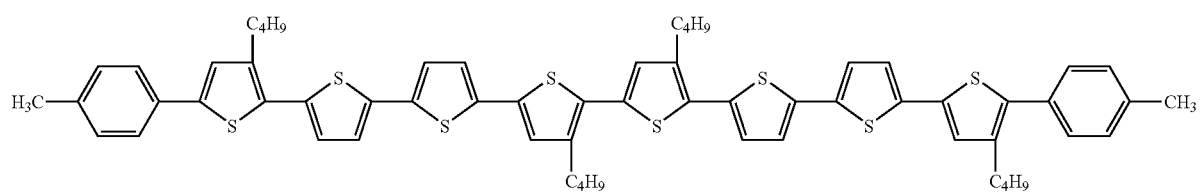
<12>
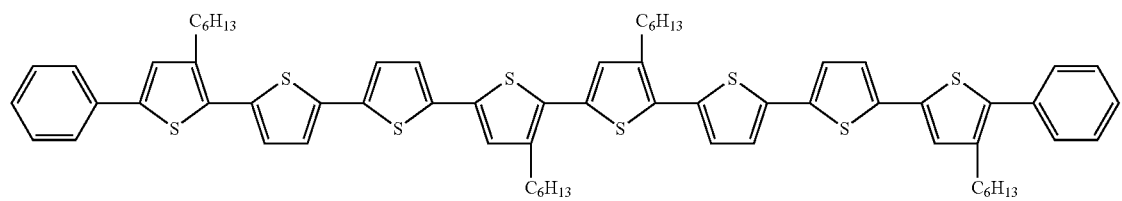
<13>
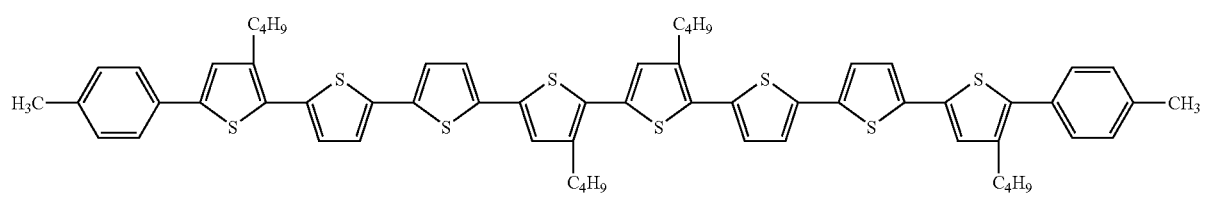
<14>
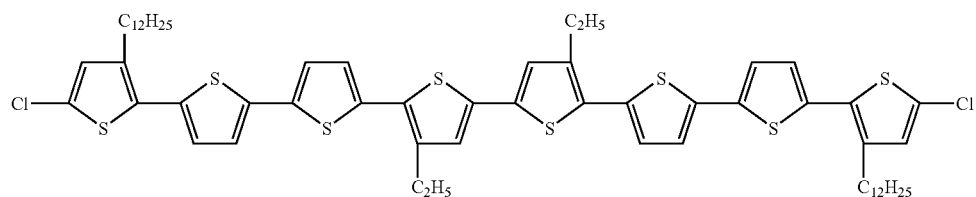
<15>
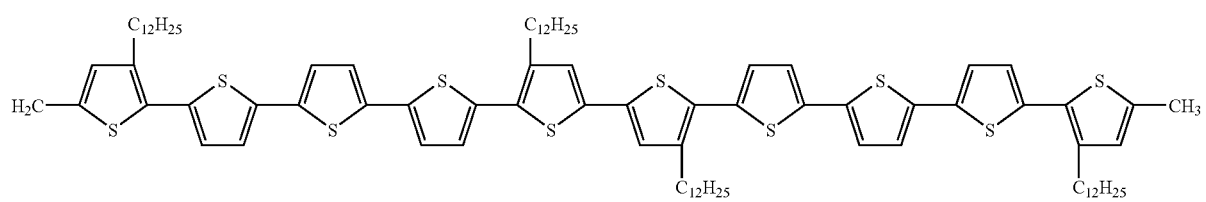
<16>
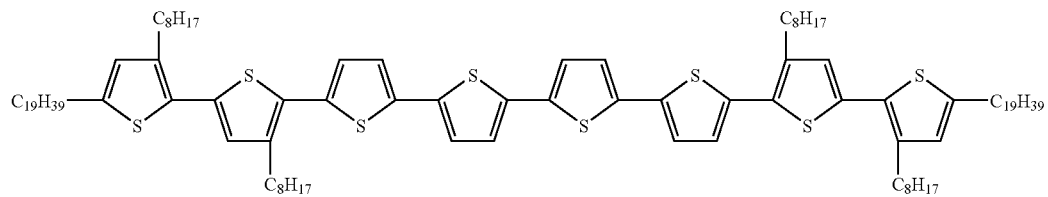
<17>

-continued
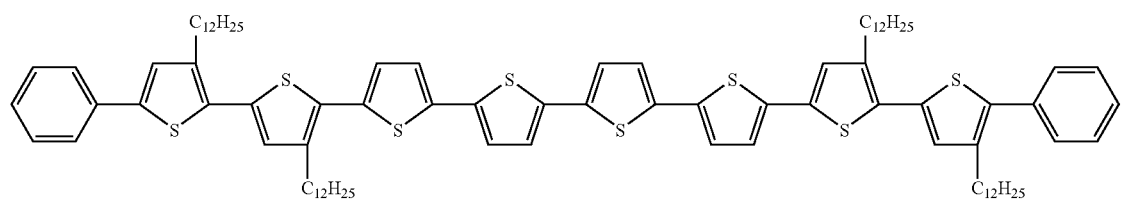
<18>
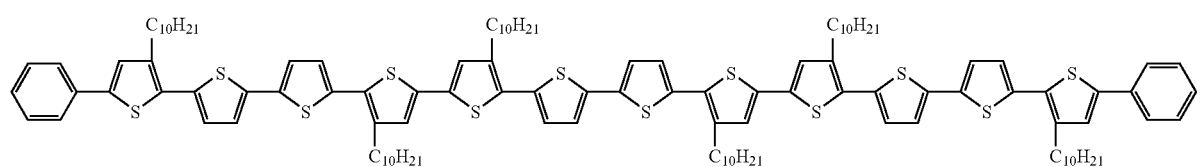
<19>
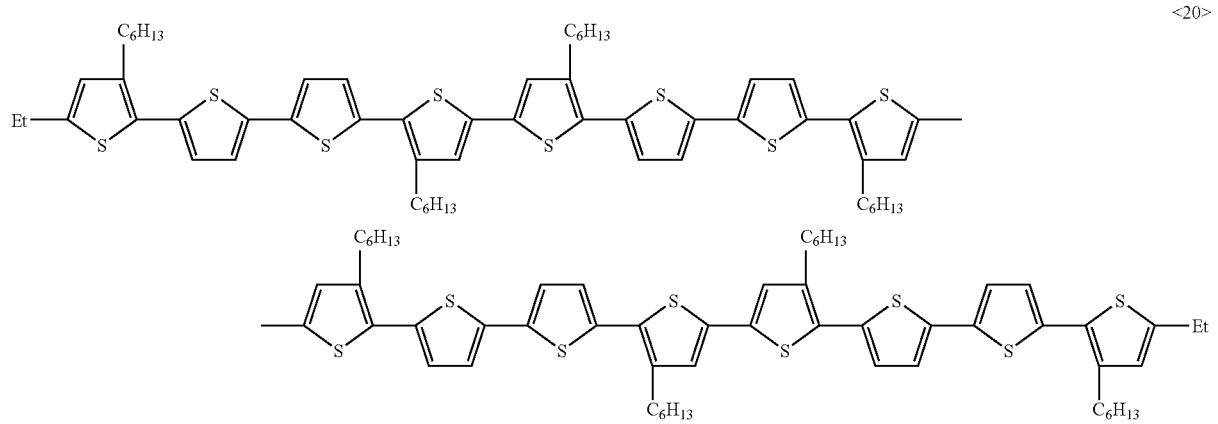
<20>
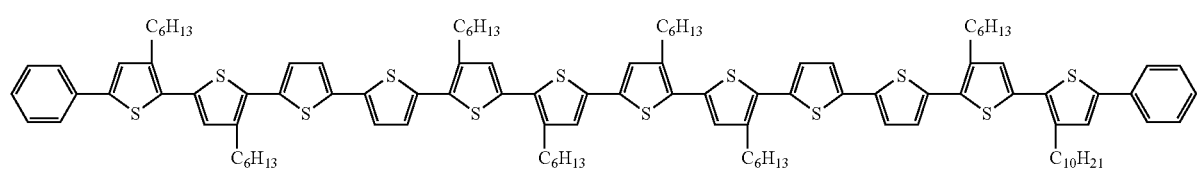
<21>
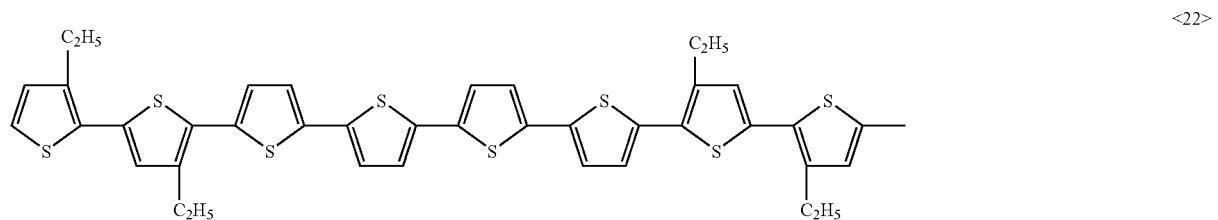
<22>
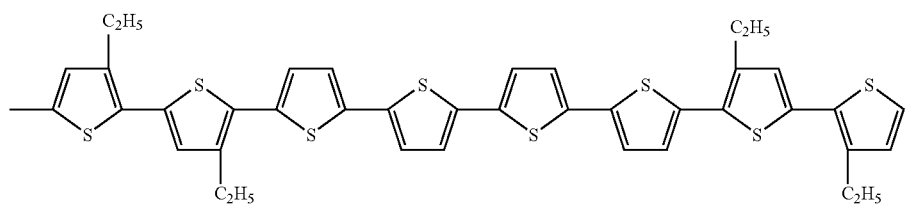
<23>                                           <24>
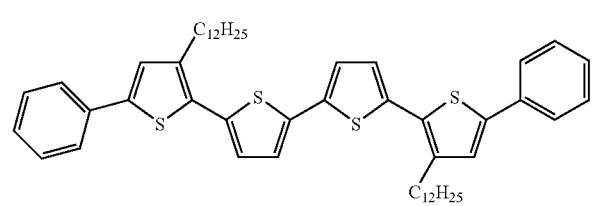

-continued
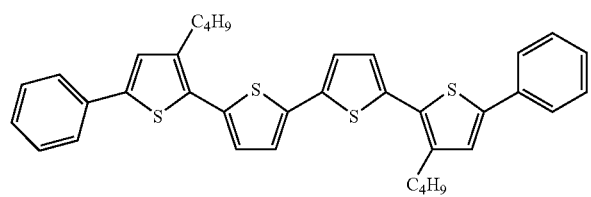
<25>
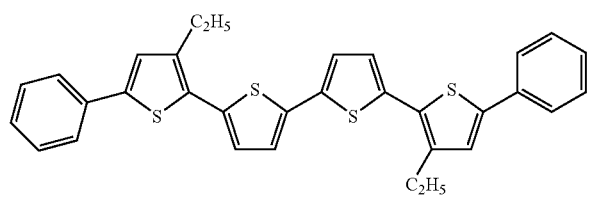
<26>
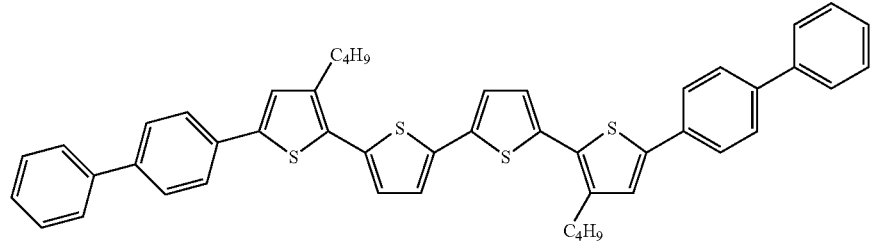
<27>
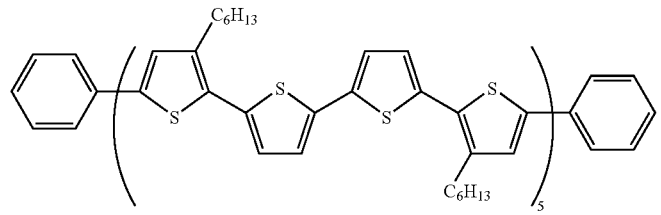
<28>
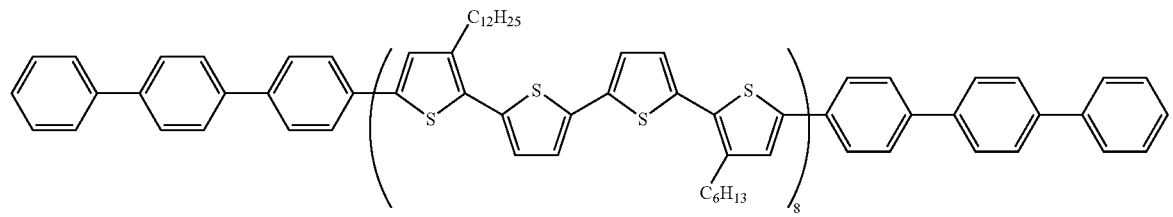
<29>
* * * * *